(12) United States Patent
Kuboi et al.

(10) Patent No.: US 10,074,517 B2
(45) Date of Patent: Sep. 11, 2018

(54) PLASMA TREATMENT METHOD, PLASMA TREATMENT APPARATUS, AND SEMICONDUCTOR DEVICE MANUFACTURING METHOD

(75) Inventors: Nobuyuki Kuboi, Kanagawa (JP); Masanaga Fukusawa, Tokyo (JP)

(73) Assignee: SONY CORPORATION, Tokyo (JP)

(*) Notice: Subject to any disclaimer, the term of this patent is extended or adjusted under 35 U.S.C. 154(b) by 167 days.

(21) Appl. No.: 13/543,796

(22) Filed: Jul. 7, 2012

(65) Prior Publication Data

US 2013/0017672 A1 Jan. 17, 2013

(30) Foreign Application Priority Data

Jul. 15, 2011 (JP) .................. 2011-156533

(51) Int. Cl.
- *H01L 21/30* (2006.01)
- *H01J 37/32* (2006.01)
- *H01L 21/02* (2006.01)
- *H01L 21/28* (2006.01)

(52) U.S. Cl.
CPC .... *H01J 37/32082* (2013.01); *H01L 21/0206* (2013.01); *H01L 21/02041* (2013.01); *H01L 21/02043* (2013.01); *H01L 21/02057* (2013.01); *H01L 21/02063* (2013.01); *H01L 21/0234* (2013.01); *H01L 21/02664* (2013.01); *H01L 21/28185* (2013.01)

(58) Field of Classification Search
CPC ........... H01L 21/0234; H01L 21/28185; H01L 21/02068; H01L 21/02664; H01L 21/02041; H01L 21/02043; H01L 21/02057; H01L 21/0206; H01L 21/02063; H01J 37/3208; H01J 37/32082

USPC ................ 438/471, 474, 477, 795, 798, 958
See application file for complete search history.

(56) References Cited

U.S. PATENT DOCUMENTS

| | | | | |
|---|---|---|---|---|
| 2,989,147 | A * | 6/1961 | Gollmar | 95/170 |
| 4,855,017 | A * | 8/1989 | Douglas | 438/695 |
| 5,200,161 | A * | 4/1993 | Fischer et al. | 423/236 |
| 5,679,214 | A * | 10/1997 | Kuo | 134/1.1 |
| 5,843,847 | A * | 12/1998 | Pu et al. | 438/723 |
| 5,888,591 | A * | 3/1999 | Gleason et al. | 427/522 |
| 5,983,906 | A * | 11/1999 | Zhao et al. | 134/1.1 |
| 6,022,813 | A * | 2/2000 | Kobayashi et al. | 438/778 |
| 6,103,137 | A * | 8/2000 | Park | 216/67 |
| 6,277,173 | B1 * | 8/2001 | Sadakata et al. | 95/12 |
| 6,284,149 | B1 * | 9/2001 | Li et al. | 216/64 |

(Continued)

FOREIGN PATENT DOCUMENTS

| | | |
|---|---|---|
| JP | 10-074753 | 3/1998 |
| JP | 2005-033038 | 2/2005 |
| JP | 2008-000729 | 1/2008 |

OTHER PUBLICATIONS

Hua et al. "Study of C4F8/N2 and C4F8/Ar/N2 plasmas for highly selective organosilicate glass etching over Si3N4 and SiC", J. Vac. Sci. Technol. A vol. 21. No. 5, 2003, pp. 1708-1716.*

(Continued)

*Primary Examiner* — Mary Wilczewski
(74) *Attorney, Agent, or Firm* — Chip Law Group

(57) ABSTRACT

A plasma treatment method includes: creating a plasma from a mixed gas containing carbon and nitrogen to generate CN active species, and treating a surface of a semiconductor substrate with the CN active species.

13 Claims, 10 Drawing Sheets

(56) References Cited

U.S. PATENT DOCUMENTS

| | | | |
|---|---|---|---|
| 6,531,067 B1 * | 3/2003 | Shiokawa et al. | 216/17 |
| 6,613,681 B1 * | 9/2003 | Hillyer et al. | 438/704 |
| 6,670,705 B1 * | 12/2003 | Harris et al. | 257/702 |
| 6,776,851 B1 * | 8/2004 | Singh et al. | 134/26 |
| 6,793,849 B1 * | 9/2004 | Gruen et al. | 252/502 |
| 6,897,154 B2 * | 5/2005 | Leung et al. | 438/706 |
| 7,005,390 B2 * | 2/2006 | RamachandraRao | H01L 21/76808 257/783 |
| 7,351,663 B1 * | 4/2008 | Kabansky et al. | 438/706 |
| 7,556,970 B2 * | 7/2009 | Hori et al. | 438/4 |
| 2004/0072436 A1 * | 4/2004 | RamachandraRao | H01L 21/76808 438/692 |
| 2004/0198037 A1 * | 10/2004 | Iba | 438/634 |
| 2006/0162818 A1 * | 7/2006 | Kumar | B82Y 30/00 148/222 |
| 2006/0211265 A1 * | 9/2006 | Trott | 438/778 |
| 2007/0207275 A1 * | 9/2007 | Nowak et al. | 427/569 |
| 2008/0032507 A1 * | 2/2008 | Ventzek et al. | 438/706 |
| 2008/0146036 A1 * | 6/2008 | Lai et al. | 438/710 |
| 2008/0311755 A1 * | 12/2008 | Zin et al. | 438/700 |
| 2009/0137130 A1 * | 5/2009 | Trott | 438/763 |
| 2012/0115334 A1 * | 5/2012 | Takaba | 438/784 |

OTHER PUBLICATIONS

Gruger et al. "Deposition of CNx thin films by plasma-activated chemical vapour deposition using various precursors as carbon source", J. Matls. Sci. 32, 1997, pp. 2849-2853.*

Labelle et al. "Fourier transform infrared spectroscopy of effluents from pulsed plasmas of 1,1,2,2-tetrafluoroethane, hexafluoropropylene oxide, and difluoromethane", J. Vac. Sci. Technol. A. 17(6), 1999, pp. 3419-3428.*

Zhang et al. "Mechanisms for CF2 radical generation and loss on surfaces in fluorocarbon plasmas", J. Vac. Sci. Technol. A. 18(6), 2000, pp. 2661-2668.*

Liu et al. "Correlation of gas-phase composition with film properties in the plasma-enhanced chemical vapor deposition of hydrogenated amorphous carbon nitride films", J. Applied Physics 101, 2007, pp. 023304-1-9.*

Clay et al. "Characterization of a—C:H:N deposition from CH4/N2 rf plasmas using optical emission spectroscopy", J. Appl. Phys. 79(9), 1996, pp. 7227-7233.*

Liu et al. "Comparison of surface reactivity of CN, NH, and NH2 radicals during deposition of amorphous carbon nitride films from inductively coupled rf plasmas", J. Vac. Sci. Technol. A. 25(2), 2007, pp. 368-377.*

Miyata et al. "Absolute density measurement of cyanogen fluoride in CHF3/N2 electron cyclotron resonance plasma using infrared diode laser absorption spectroscopy", J. Appl. Phys. 82(10), 1997, pp. 4777-4780.*

Wang et al. "Optical emission spectroscopy study of the influence of nitrogen on carbon nanotube growth", Carbon 41, 2003, pp. 1827-1831.*

Young et al. "Cyanide remediation: Current and past technologies", Proc. of 10th Annual Conference on Hazardous Waste Research, 2004, pp. 104-129.*

Laer et al. "Etching of low-k materials for microelectronics applications by means of a N2/H2 plasma: modeling and experimental investigation", Plasma Sources Sci. Technol. 22 (2013) 025011 pp. 1-19.*

Osamu Maida et al.; Experimental and theoretical studies of Si—Cn bonds to eliminate interface states at Si/SiO2 interface; Surface Science 542; 2003; 244-252.

* cited by examiner

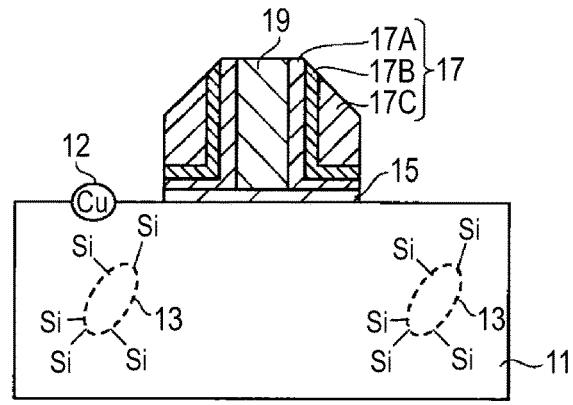
FIG.6A
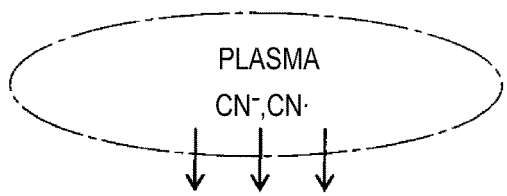
FIG.6B
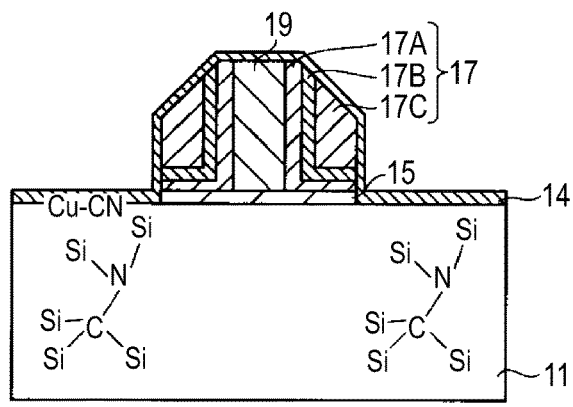
FIG.6C
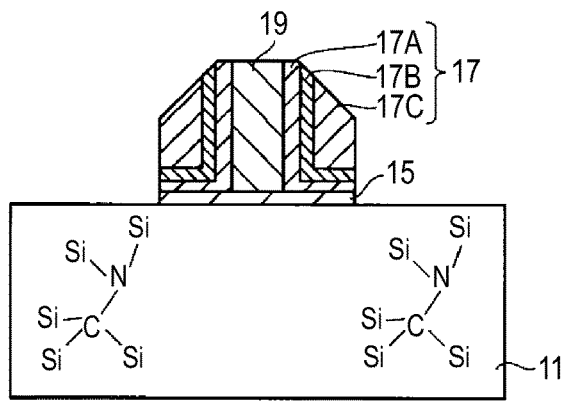

PLASMA TREATMENT METHOD, PLASMA TREATMENT APPARATUS, AND SEMICONDUCTOR DEVICE MANUFACTURING METHOD

FIELD

The present technology relates to semiconductor substrate plasma treatment methods, plasma treatment apparatuses, and semiconductor device manufacturing methods.

BACKGROUND

It is known in semiconductor production that the crystal defects in a semiconductor substrate and the metal contamination that occurs during the fabrication represent a serious factor in the deterioration of device characteristics. Known examples of such defects include white spots and dark currents in MOS (Metal Oxide Semiconductor), CCD (Charge Coupled Device), and CMOS (Complementary Metal Oxide Semiconductor) imaging sensors. Such deterioration of device characteristics is known to occur in RTS (Random Telegraph Signal noise), gate I-V characteristics, solar cell conversion efficiency, and laser output characteristics. One of the big challenges in semiconductor device production, then, is to reduce such defects and contamination in a semiconductor substrate.

There has been proposed a useful technique whereby $CN^-$ (cyano ions) present in a HCN solution are used to greatly reduce crystal defects and metal contamination in a semiconductor substrate (see, JP-A-10-74753, and JP-A-2005-33038). In this technique, the $CN^-$ are allowed to selectively react with the metals and crystal defects (dangling bonds) present on the semiconductor substrate surface or in the substrate. The reaction forms a stable complex and removes the metals, or forms bonds with the dangling bonds to passivate the defects. In this technique, the reaction sufficiently takes place at room temperature. It is known that the technique is very resistant to ultraviolet light or high temperatures of about 800° C.

Because the method using a HCN solution involves the high toxicity of HCN, it is difficult to use the method in the current production lines from the standpoint of chemical treatment. As a countermeasure, a method is proposed in which HCN is produced from methane and ammonia using a catalyst, and in which the HCN used is detoxified and decomposed into carbon dioxide gas and nitrogen by ultraviolet irradiation and ozone water treatment (see JP-A-2008-729).

The treatment method using HCN is considered very effective for the reduction of crystal defects and metal contamination. In fact, for example, there is a report of applying the method to silicon solar cells at the experimental level, and actually improving efficiency by a large margin (see O. Maida, A. Asano, M. Takahashi, H. Iwasa, H. Kobayashi, Surf. Sci. 542 (2003) 244).

SUMMARY

However, use of the technique using HCN in the actual production lines involves production of a designated novel treatment apparatus, and is therefore not practical.

Accordingly, there is a need for a semiconductor substrate treatment method that can reduce crystal defects and metal contamination.

An embodiment of the present technology is directed to a plasma treatment method that creates a plasma from a mixed gas containing carbon and nitrogen to generate CN active species, and that treats a surface of a semiconductor substrate with the CN active species.

An embodiment of the present technology is directed to a semiconductor device manufacturing method that includes forming a semiconductor component on a semiconductor substrate subjected to the plasma treatment.

Still another embodiment of the present technology is directed to a plasma treatment apparatus that includes a plasma treatment unit that creates a plasma from a mixed gas containing carbon and nitrogen, and that treats a surface of a semiconductor substrate with the generated CN active species.

The plasma treatment method and the plasma treatment apparatus can be applied to a plasma treatment step in a common semiconductor manufacturing process without using the highly toxic HCN solution or HCN gas, and can repair crystal defects and remove metal contamination in a semiconductor substrate. This makes it possible to produce a semiconductor device in which the deterioration of various device characteristics due to crystal defects and metal contamination can be suppressed.

The embodiments of the present technology can provide a semiconductor substrate treatment method that can reduce crystal defects and metal contamination.

BRIEF DESCRIPTION OF THE DRAWINGS

FIGS. 6A to 6C are diagrams schematically representing the steps of a plasma treatment method according to Fifth Embodiment.

DETAILED DESCRIPTION

The following will describe examples of the best mode for carrying out the present technology. It should be noted that the present technology is not limited to the following examples.

Descriptions will be given in the following order.

1. First Embodiment of Plasma Treatment Method
2. Second Embodiment of Plasma Treatment Method
3. Third Embodiment of Plasma Treatment Method
4. Fourth Embodiment of Plasma Treatment Method 5. Fifth Embodiment of Plasma Treatment Method
6. Sixth Embodiment of Plasma Treatment Method
7. Seventh Embodiment of Plasma Treatment Method
8. Embodiment of Plasma Treatment Apparatus <1. First Embodiment of Plasma Treatment Method>

Figure 1A:
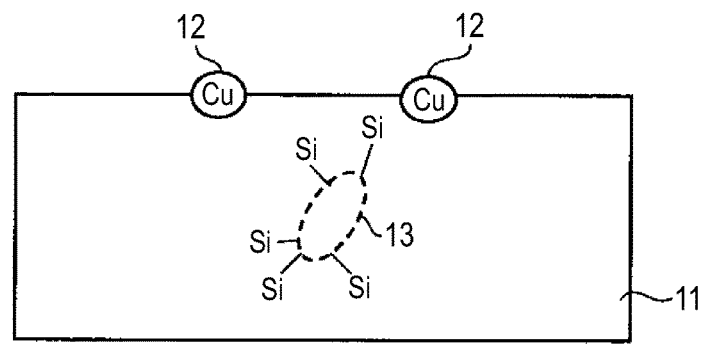
FIGS. 1A to 1C are diagrams schematically representing the steps of a plasma treatment method according to First Embodiment.
Figure 1B:
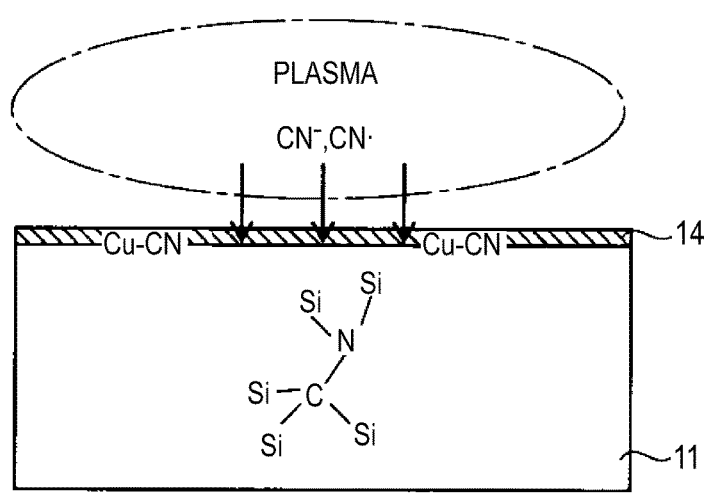
Figure 1C:
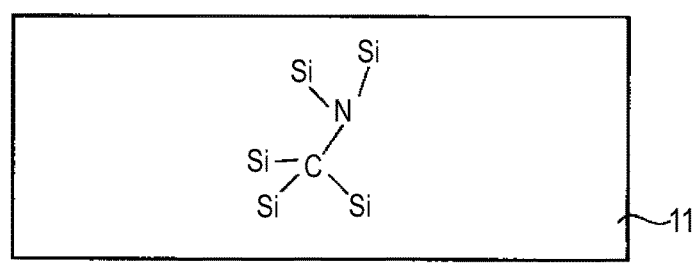

A specific embodiment of a plasma treatment method is described below. FIGS. 1A to 1C are diagrams schematically representing the steps of the plasma treatment method of the present embodiment.

As illustrated in FIG. 1A, a target semiconductor substrate 11 is prepared. For example, a silicon substrate is prepared as the semiconductor substrate 11. The semiconductor substrate 11 has contaminant metals 12, and crystal defects 13 such as silicon dangling bonds. In FIG. 1A, Cu is shown as an example of the contaminant metals 12 in the semiconductor substrate 11.

[CN Generation by Plasma Treatment]

As illustrated in FIG. 1B, the semiconductor substrate 11 is plasma treated using a plasma treatment apparatus. In the present embodiment, CN active species such as CN radicals (CN.) and CN ions ($CN^-$) are generated by plasma treatment using a mixed molecular gas containing a C (carbon) element and a N (nitrogen) element.

The mixed gas used in the plasma treatment is not particularly limited, as long as it is a mixed molecular gas containing C and N. A C-containing gas may be a gas used in manufacture of a semiconductor device, for example, such as $CHF_3$, $CH_2F_2$, $C_4F_8$, $C_5F_8$, CO, $C_2H_5OH$, and $CH_3OH$. A N-containing gas may be a gas used in manufacture of a semiconductor device, for example, such as $N_2$, and $NH_3$. Further, Ar gas and He gas may be used as diluting gases for the mixed molecular gas containing C and N.

Examples of the C- and N-containing mixed molecular gas include combinations of $CHF_3/N_2/(Ar)$, $CH_2F_2/N_2/(Ar)$, $C_4F_8/N_2/(Ar)$, $C_5F_8/N_2/(Ar)$, $CO/N_2/(Ar)$, $CH_3OH/NH_3/(Ar)$, and $C_2H_5OH/N_2/(Ar)$. Note that the diluting gases Ar and He are not necessarily required, provided that the plasma can stably discharge.

The plasma treatment is performed by applying high-frequency power to the mixed gas. A CCP (Capacitive Coupled Plasma) chamber is used for the plasma treatment. Aside from the CCP apparatus, apparatuses such as an ICP (Inductive Coupled Plasma) apparatus, and an ECR (Electron Cyclotron Resonance) apparatus may be used.

Plasma treatment conditions, including treatment time t, gas pressure P, chamber wall temperature Tw, and wafer temperature T are optimized so as to make the treatment by the CN active species highly effective.

The top power applied to the chamber should preferably be set to a high value, for example, about 1,000 to 2,000 W, sufficient to cause gas dissociation. The bias power is set to a value high enough to etch a polymer layer 14 deposited on the semiconductor substrate 11, but sufficiently low to not etch the target semiconductor substrate 11. For example, the bias power is set to about 50 W or less, preferably about 20 W or less. The bias power is optimized according to the gas species used, and the thickness of the polymer layer 14. Depending on the gas species used, there are cases where the polymer layer 14 is hardly formed, or is not formed at all. In this case, the plasma treatment may be performed under no bias power (0 W).

Examples of plasma treatment conditions are presented below. These conditions are used for the plasma treatment performed with a CCP etching chamber immediately after the fabrication of a CMOS image sensor silicon photodiode.

Gas flow rate: $CHF_3/N_2/Ar=100/100/500$ sccm
Top power: 1,000 W
Bias power: 20 W
Gas pressure: 30 mTorr
Wall temperature Tw: 60° C.
Wafer temperature PT: 20° C.
Treatment time t: 10 seconds A plasma is created from the C- and N-containing mixed molecular gas under the foregoing conditions to generate CN active species. The surface of the semiconductor substrate 11 is then exposed to the CN active species. By this treatment, the CN active species selectively react with the contaminant metals on the surface of the semiconductor substrate 11, or with the crystal defects in the semiconductor layer. As a result, the metals on the surface of the semiconductor substrate 11 form a stable metal complex with the CN active species, and are removed from the surface of the semiconductor substrate 11.

Further, the CN active species bind to crystal defects, for example, the silicon dangling bonds on the surface of the semiconductor substrate 11. For example, the dangling bonds in the silicon substrate bind to CN to form Si—CN bonds. In the case of silicon crystal defects, a strong Si—CN bond (4.5 eV) can be selectively formed with the silicon dangling bond to enable a repair with higher stability than in the case of hydrogen sintering (Si—H, 3.1 eV). Here, no new energy level occurs in the silicon band gap because of the CN in the silicon crystal. This has been confirmed by first-principle calculations. By repairing the crystal defects in the semiconductor substrate 11 as above, the defect level density in the semiconductor substrate 11 can be reduced.

In the plasma treatment described above, the CN active species penetrate to an about 100-nm depth in the case of polycrystalline silicon and amorphous silicon, an about several nanometer depth in the case of monocrystalline silicon and thermally-oxidized films, and a several ten nanometer depth in the case of oxide films formed by CVD using, for example, TEOS. The crystal defects can thus be removed as a result.

[Polymer Layer Removal Treatment]

The polymer layer 14 formed on the semiconductor substrate 11 during the plasma treatment is then removed.

When a fluorine gas is used as the C-containing gas, the polymer layer 14 is formed as a thin layer on the surface of the semiconductor substrate 11. Thus, as illustrated in FIG. 1C, a chemical treatment is performed for 1 min using a chemical such as SC1 ($NH_4OH+H_2SO_4$) to remove the polymer layer 14 deposited on the surface. The wet chemical treatment enables the removal of the polymer layer 14 without damaging (e.g., etching) the semiconductor substrate 11.

Specifically, the chemical treatment is performed using, for example, ammonia hydrogen peroxide water ($NH_4OH+H_2O_2$) or sulfuric acid hydrogen peroxide water ($H_2SO_4+H_2O_2$). The chemical treatment is performed for, for example, about 1 min, according to the thickness of the polymer layer 14. The treatment time is entered in advance in a recipe for a semiconductor manufacturing apparatus (described later), and is optimized according to the thickness of the polymer layer 14.

Note that the polymer layer 14 may not be formed depending on the gas species selected in the plasma treatment step. Further, under the optimum plasma treatment conditions, the polymer layer 14 may be etched, and deposition may not occur even when a fluorine gas is used. For example, the polymer layer 14 formed during the plasma treatment is simultaneously etched by plasma excitation by applying a bias power of about 20 W to the semiconductor substrate 11. Formation of the polymer layer 14 can be suppressed by optimizing these conditions in the plasma treatment step.

Further, it is preferable to optimize the gas flow rate (ratio), in order to suppress formation of the polymer layer 14 on the semiconductor substrate 11. By suppressing the formation of the polymer layer 14, it is possible to prevent the polymer layer 14 from interfering with the contact efficiency between the semiconductor substrate 11 and the CN active species. Further, the labor required for the chemical removal of the polymer layer 14 can be reduced.

Finally, the surface of the semiconductor substrate 11 subjected to the chemical treatment is washed with deionized water.

The plasma treatment method may be performed by using a plasma treatment step of the existing MOS or imaging device manufacturing process. The plasma treatment method can thus be easily introduced to the existing semiconductor device manufacturing step. Further, the plasma treatment method can be performed using a manufacturing apparatus of the existing production line, without newly introducing a manufacturing apparatus.

The presence or absence of the plasma treatment can be predicted and determined by using various analysis techniques. For example, the plasma treatment can be determined by the ESR (Electron Spin Resonance) measurement of the dangling bond amounts in the substrate, and by the XPS (X-ray Photoelectron Spectroscopy) measurement of N amounts.

[Semiconductor Device Produced Using the Manufacturing Method and Manufacturing Apparatus]

A semiconductor device can be produced by forming a semiconductor component (active device), such as various diodes, transistors, and electronic components, on the semiconductor substrate subjected to the plasma treatment.

The plasma treatment also may be applied to, for example, compound semiconductors and oxide semiconductors such as $Cu_2O$ and GaAs, other than silicon monocrystals. The plasma treatment also may be applied to semiconductors doped with various impurities. For example, the plasma treatment may be applied to a photodiode forming the pixel portion of a solid-state imaging device to repair crystal defects in the impurity region of the photodiode, and to reduce generation of white spots and dark currents. Further, for example, the plasma treatment may be applied to a semiconductor substrate forming a pn junction-type solar cell to repair crystal defects, and to thus improve conversion efficiency. The semiconductor substrate may be of any type, including monocrystalline, polycrystalline, and amorphous.

The semiconductor components formed on the semiconductor substrate subjected to the plasma treatment may be produced by using known methods. Further, the plasma treatment may be performed on the semiconductor substrate before or after forming the semiconductor component. The plasma treatment can repair crystal defects also in the gate insulating film, the gate electrode, and the isolation region of the transistor formed on the semiconductor substrate. Crystal defects can be repaired also in the polysilicon layer and the amorphous silicon layer formed on the substrate, and in regions of these layers containing impurities injected by ion implantation.

[Electronic Device]

Figure 2:
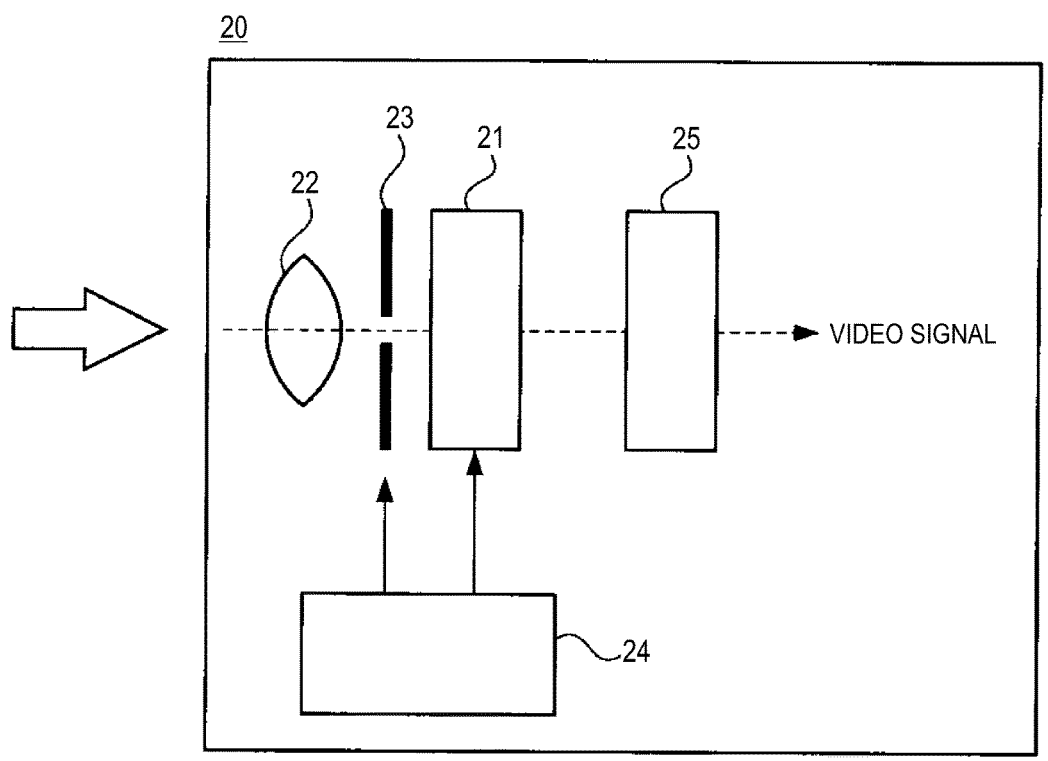
FIG. 2 is a diagram representing a configuration of an electronic device according to an embodiment.

An electronic device may be formed using a semiconductor device produced by application of the plasma treatment. FIG. 2 represents an example of an electronic device, showing a configuration of a still-image or moving-image video camera that includes a solid-state imaging device produced by applying the plasma treatment. The solid-state imaging device is applicable to, for example, various electronic devices, including camera systems such as digital cameras and video cameras; cell phones having imaging functions; and various other devices having imaging functions.

For example, a camera 20 includes a solid-state imaging device 21, an optical system 22 that guides the incident light to the light-receiving sensor section of the solid-state imaging device 21, a shutter unit 23 provided between the solid-state imaging device 21 and the optical system 22, and a drive circuit 24 that drives the solid-state imaging device 21 and the shutter unit 23. The camera 20 also includes a signal processing circuit 25 that processes the output signals from the solid-state imaging device 21.

The solid-state imaging device 21 may be realized by a semiconductor device produced by using a semiconductor substrate subjected to the plasma treatment.

The optical system (optical lens) 22 forms an image on the imaging face (not illustrated) of the solid-state imaging device 21 from the subject image (incident light). Thus, signal charges accumulate in the solid-state imaging device 21 for a certain time period. The optical system 22 may be configured from optical lens elements that include a plurality of optical lenses. The shutter unit 23 controls the exposure time of the incident light on the solid-state imaging device 21.

The drive circuit 24 supplies drive signals to the solid-state imaging device 21 and the shutter unit 23. With the drive signals, the drive circuit 24 controls the signal output operation from the solid-state imaging device 21 to the signal processing circuit 25, and the shutter operation of the shutter unit 23. Specifically, in this example, the signal transfer operation from the solid-state imaging device 21 to the signal processing circuit 25 is performed using the drive signals (timing signals) supplied from the drive circuit 24.

The signal processing circuit 25 performs various signal processes for the signals transferred from the solid-state imaging device 21. The signals (video signals) subjected to various signal processes are stored in a storage medium such as memory (not illustrated), or output to a monitor (not illustrated).

The solid-state imaging device is not limited to the application as a solid-state imaging device that detects the distribution of the incident visible light quantity for imaging, and is also applicable as a solid-state imaging device that uses the distribution of the incident quantity of infrared rays, X-rays, or particles for imaging. In a broad sense, the solid-state imaging device is applicable to a wide range of solid-state imaging devices (physical quantity distribution detectors), such as a fingerprint detecting sensor, that detect the distribution of other physical quantities such as pressure and capacitance for imaging.

Further, the solid-state imaging device is not limited to a solid-state imaging device that sequentially scans the unit pixels of the pixel array portion in units of rows to read pixel signals from each unit pixel. For example, the solid-state imaging device is also applicable as an X-Y addressing solid-state imaging device that selects arbitrary pixels in units of pixels, and reads signals from the selected pixels in units of pixels.

The solid-state imaging device may have a form of a single chip, or may be in the form of a module having imaging functions as a package of an imaging section and a signal processor or an optical system.

Though the present embodiment has been described using a camera as an example of the electronic device, the electronic device may be an electronic device that includes, for example, a semiconductor device (for example, sensor devices such as a CCD and a CIS (CMOS Image Sensor), memory devices, laser devices, display devices, and energy devices as represented by solar cells) having high pixel characteristics, high logic characteristics, and high energy output characteristics.

<2. Second Embodiment of Plasma Treatment Method>

Figure 3A:
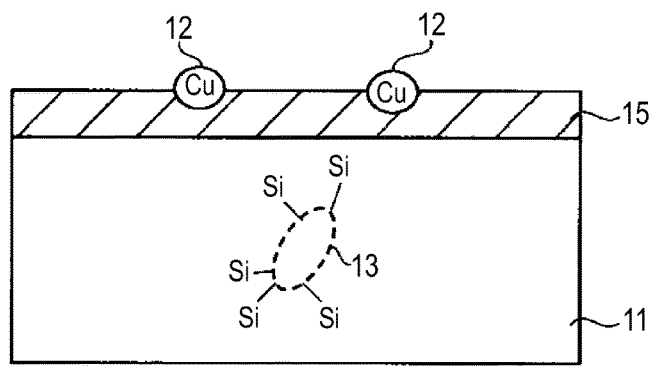
FIGS. 3A to 3C are diagrams schematically representing the steps of a plasma treatment method according to Second Embodiment.
Figure 3B:
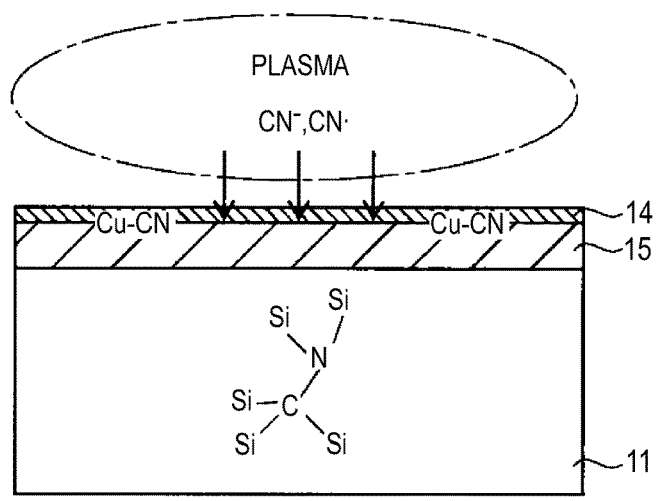
Figure 3C:
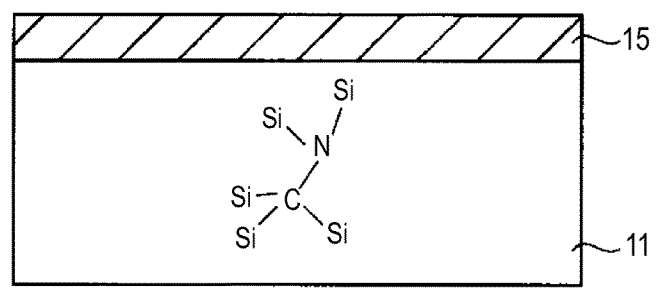

Second Embodiment of the plasma treatment method is described below. FIGS. 3A to 3C schematically represent the steps of the plasma treatment method of the present embodiment.

First, as illustrated in FIG. 3A, a target semiconductor substrate 11 is prepared. Then, an oxide film 15 of, for example, about 2 nm is formed on the semiconductor substrate 11 using a thermal oxidation method. The oxide film 15 becomes the gate insulating film when forming a semiconductor component, for example, a MOSFET, mounted on a semiconductor device. As illustrated in FIG. 3A, the semiconductor substrate 11 has contaminant metals 12 and crystal defects 13.

In the present embodiment, the semiconductor layer surface of the semiconductor substrate 11 is subjected to plasma treatment over the oxide film 15.

Then, as illustrated in FIG. 3B, a plasma is created from a mixed molecular gas containing a C element and a N element, and CN active species such as CN radicals (CN.) and CN ions (CN−) are generated by using the same method described in First Embodiment. The surface of the semiconductor substrate 11 with the oxide film 15 is then exposed to the CN active species.

By the treatment, the CN active species selectively react with the contaminant metals on the surface of the oxide film 15. The metals on the surface of the semiconductor substrate 11 form a stable metal complex with the CN active species, and are removed from the surface of the semiconductor substrate 11.

Further, the CN active species pass through the oxide film 15, and selectively react with the crystal defects on the surface of the semiconductor layer of the semiconductor substrate 11. Thus, even with the oxide film 15 formed on the surface, the CN active species can bind to defects, for example, the silicon dangling bonds on the surface of the semiconductor layer of the semiconductor substrate 11, and repair the crystal defects.

The polymer layer 14 formed on the semiconductor substrate 11 during the plasma treatment is then removed.

When a fluorine gas is used as the C-containing gas, the polymer layer 14 is formed as a thin layer on the surface of the semiconductor substrate 11. Thus, as illustrated in FIG. 3C, the semiconductor substrate 11 is treated by wet etching using a chemical to remove the polymer layer 14 deposited on the surface. The removal of the polymer layer 14 is not necessary when the plasma treatment is performed under the conditions that do not form the polymer layer 14.

Finally, the surface of the semiconductor substrate 11 is washed with deionized water.

As described above, even with the oxide film 15 formed on the semiconductor substrate 11, the crystal defects in the semiconductor substrate 11 can be repaired by the plasma treatment performed on the surface of the semiconductor substrate 11 over the oxide film 15. For example, in the case of a dense oxide film such as the thermally-oxidized film as above, the semiconductor substrate 11 may be treated to the depth of about several nanometers. In the case of a less dense oxide film such as a TEOS, the semiconductor layer underneath the oxide film can be treated even when the oxide film has a greater thickness of about several ten nanometers.

The crystal defects present at the interface between the semiconductor layer of the semiconductor substrate 11 and the oxide film 15, for example, crystal defects at the $Si/SiO_2$ interface can be reduced by the plasma treatment of the semiconductor substrate 11 having the oxide film formed thereon. In this way, it is possible to improve the transistor gate I-V characteristics, and to reduce RTS noise, for example.

<3. Third Embodiment of Plasma Treatment Method>

Figure 4A:
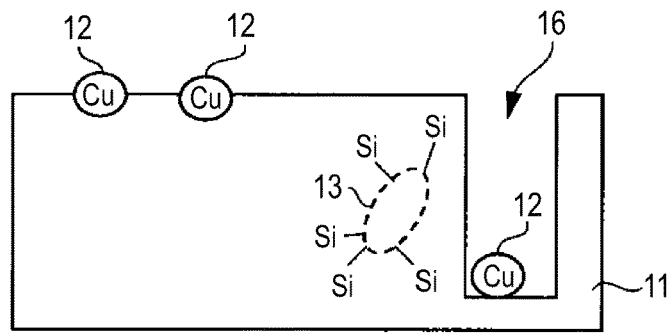
FIGS. 4A to 4C are diagrams schematically representing the steps of a plasma treatment method according to Third Embodiment.
Figure 4B:
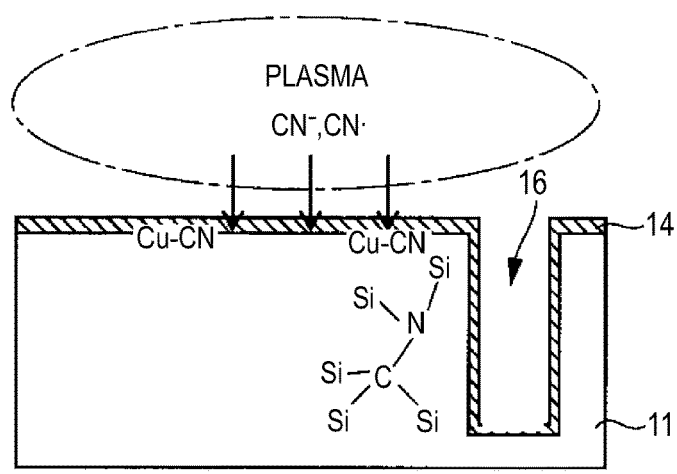
Figure 4C:
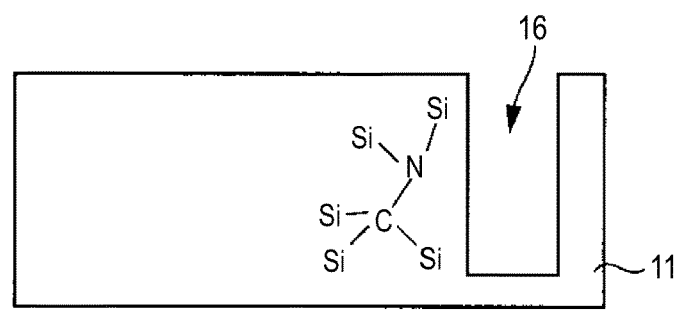

Third Embodiment of the plasma treatment method is described below. FIGS. 4A to 4C schematically represent the steps of the plasma treatment method of the present embodiment.

First, as illustrated in FIG. 4A, a target semiconductor substrate 11 is prepared. Then, a trench 16 is formed in the semiconductor substrate 11 by using, for example, RIE (Reactive Ion Etching). The trench 16 is, for example, a ditch that becomes a light shielding structure within the pixel of a solid-state imaging device formed in a semiconductor device. The trench 16 may also be provided, for example, as a trench for forming an STI (Shallow Trench Isolation), or a trench for forming a gate electrode for a vertical transistor. As illustrated in FIG. 4A, the semiconductor substrate 11 has contaminant metals 12 and crystal defects 13.

In the present embodiment, the plasma treatment is performed for the surface of the semiconductor substrate 11, and for the surfaces exposed in the trench 16.

Then, as illustrated in FIG. 4B, a plasma is created from a mixed molecular gas containing a C element and a N element, and CN active species such as CN radicals (CN.) and CN ions (CN−) are generated by using the same method described in First Embodiment. The semiconductor substrate 11 is then exposed to the CN active species to treat the surface of the semiconductor substrate 11, and the inner surfaces of the trench 16 with the CN active species.

By the treatment, the CN active species selectively react with the contaminant metals on the surface of the semiconductor substrate 11, and with the contaminant metals in the trench 16. As a result, the metals form a stable metal complex with the CN active species, and are removed from the semiconductor substrate 11.

The CN active species enter the semiconductor substrate 11 from the surface of the semiconductor substrate 11, and from the exposed surfaces inside the trench 16. Thus, the CN active species selectively react with the crystal defects of the semiconductor substrate 11 all the way from the surface of the semiconductor substrate 11 and deep into the trench 16, and the crystal defects in the semiconductor substrate 11 can be repaired.

Then, the polymer layer 14 formed on the semiconductor substrate 11 during the plasma treatment is removed.

In the present embodiment, the polymer layer 14 also deposits in the trench 16. Thus, as illustrated in FIG. 4C, the polymer layer 14 is removed by the wet etching of the semiconductor substrate 11 using a chemical. The removal of the polymer layer 14 is not necessary when the plasma treatment is performed under the conditions that do not form the polymer layer 14. Finally, the surface of the semiconductor substrate 11 is washed with deionized water.

As described above, even with the trench 16 formed in the semiconductor substrate 11, the plasma treatment can be performed for the semiconductor substrate 11, including the inner surfaces of the trench 16. The crystal defects and the metal contamination formed in the semiconductor substrate 11, and at the side walls and the bottom of the trench 16 can thus be reduced.

It is therefore possible to reduce white spots and dark currents, for example, when the trench is formed as a ditch for forming a light shielding structure in the pixel of the solid-state imaging device, or for forming an STI. Further, when the trench is provided for forming a gate electrode for a vertical transistor, the crystal defects and metal contamination on the bottom and side surfaces of the gate electrode can be reduced, and improvement of saturated charge amount (Qs) can be expected.

Note that, in the present embodiment, the oxide film may be formed on the semiconductor substrate 11 and on the inner walls of the trench 16 in the manner described in Second Embodiment. The plasma treatment of the semiconductor substrate 11 and the trench 16 is also possible even with the oxide film.

The same treatment apparatus may be used for the etching chamber used to form the trench by RIE or the like, and for the plasma treatment chamber used for surface treatment with the CN active species, depending on the gas species and the treatment conditions used. Instead, these treatments may be performed using separate apparatuses.

<4. Fourth Embodiment of Plasma Treatment Method>

Figure 5A:
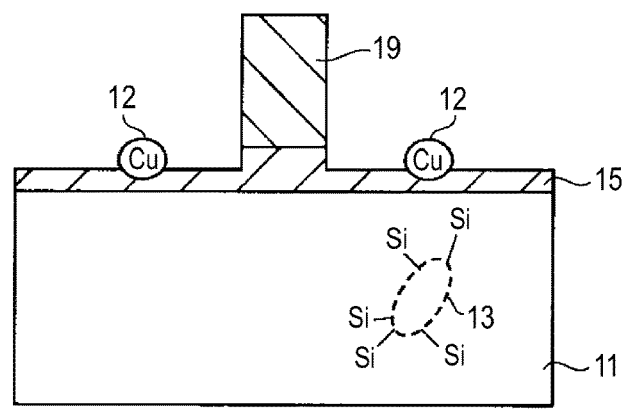
FIGS. 5A to 5C are diagrams schematically representing the steps of a plasma treatment method according to Fourth Embodiment.
Figure 5B:
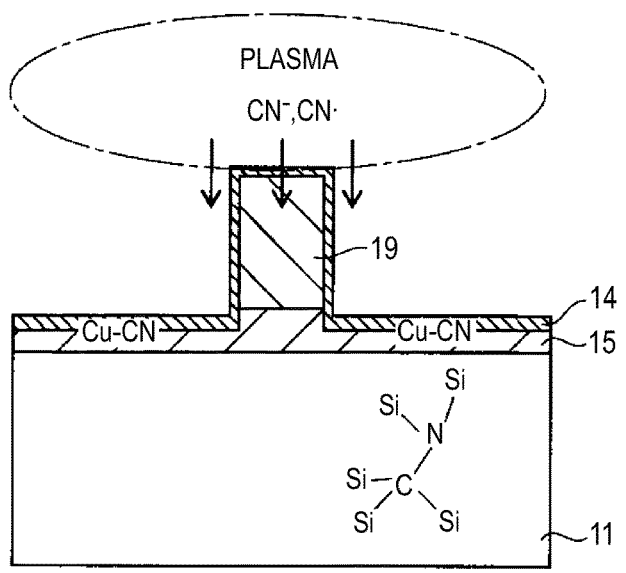
Figure 5C:
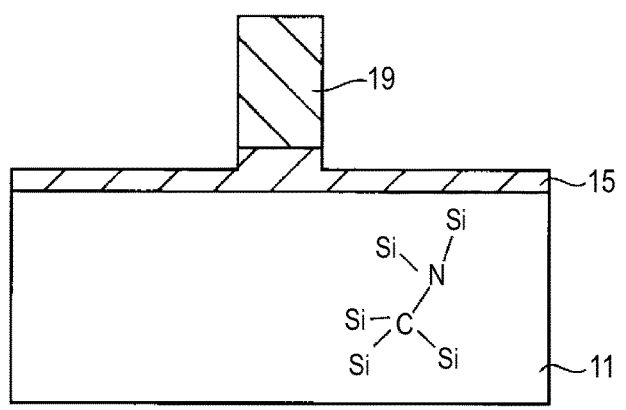

Fourth Embodiment of the plasma treatment method is described below. FIGS. 5A to 5C schematically represent the steps of the plasma treatment method of the present embodiment.

First, as illustrated in FIG. 5A, a target semiconductor substrate 11 is prepared. Then, an oxide film 15 of, for example, about 2 nm is formed on the semiconductor substrate 11 using a thermal oxidation method, followed by formation of a polysilicon layer on the oxide film 15. The polysilicon layer is then fabricated into a shape of a gate electrode using the photolithography technique to form a polysilicon gate electrode 19.

The oxide film 15 and the polysilicon gate electrode 19 are the gate insulating film and the gate electrode for forming a semiconductor component, for example, such as a MOSFET, mounted on a semiconductor device. As illustrated in FIG. 5A, the semiconductor substrate 11 has contaminant metals 12 and crystal defects 13.

In the present embodiment, the plasma treatment is performed simultaneously for the polysilicon gate electrode 19 and the semiconductor substrate 11. The plasma treatment of the semiconductor substrate 11 is performed over the oxide film 15.

Then, as illustrated in FIG. 5B, a plasma is created from a mixed molecular gas containing a C element and a N element, and CN active species such as CN radicals (CN.) and CN ions (CN−) are generated in the same manner as in First Embodiment. The surface of the semiconductor substrate 11 with the oxide film 15, and the polysilicon gate electrode 19 are then exposed to the CN active species.

By the treatment, the CN active species selectively react with the contaminant metals on the surfaces of the oxide film 15 and the polysilicon gate electrode 19. The contaminant metals form a stable metal complex with the CN active species, and are removed from the semiconductor substrate 11.

The CN active species also selectively react with the crystal defects in the polysilicon gate electrode 19. Further, the CN active species pass through the polysilicon gate electrode 19 and the oxide film 15, and selectively react with crystal defects on the surface of the semiconductor substrate 11. Thus, even with the polysilicon gate electrode 19 and the oxide film 15 formed on the surface, the CN active species can bind to crystal defects, for example, the silicon dangling bonds on the surface of the semiconductor substrate 11, and can repair the defects.

The polymer layer 14 formed on the semiconductor substrate 11 during the plasma treatment is then removed.

In the present embodiment, the polymer layer 14 also deposits on the polysilicon gate electrode 19. Thus, as illustrated in FIG. 5C, the polymer layer 14 is removed by the wet etching of the semiconductor substrate 11 using a chemical. The removal of the polymer layer 14 is not necessary when the plasma treatment is performed under the conditions that do not form the polymer layer 14. Finally, the surface of the semiconductor substrate 11 is washed with deionized water.

As described above, even with the polysilicon gate electrode, crystal defects in the semiconductor substrate 11 can be repaired by performing the plasma treatment for the surface of the semiconductor substrate 11 over the polysilicon gate electrode 19 and the oxide film 15. Crystal defects in the polysilicon gate electrode 19 can also be repaired simultaneously when repairing the crystal defects in the semiconductor substrate 11.

The CN active species enter the semiconductor substrate 11 to the depth of about several hundreds nanometers when polysilicon or amorphous silicon is used. Thus, the CN active species enter not only the polysilicon gate electrode 19, but the gate insulating film 15 formed underneath the polysilicon gate electrode 19, and the semiconductor substrate 11 formed underneath the gate insulating film 15.

In this way, it is possible to reduce the crystal defects in the polysilicon gate electrode, and the crystal defects at the interface of the polysilicon gate electrode and the gate insulating film. The crystal defects at the interface of the semiconductor substrate 11 and the oxide film also can be reduced. It is therefore possible to reduce the leak current in a semiconductor device having the polysilicon gate electrode and the gate insulating film. It is also possible to improve the I-V characteristics of the transistor gate, and to reduce RTS noise, for example.

Further, a semiconductor device, such as an MOSFET, having the oxide film 15 and the polysilicon gate electrode 19 can be produced by performing ion implantation in the semiconductor substrate 11 after the plasma treatment of the present embodiment. Further, the plasma treatment of the present embodiment may be performed after forming the oxide film 15 and the polysilicon gate electrode 19 on the semiconductor substrate 11 subjected to ion implantation in advance.

In this manner, the plasma treatment of the present embodiment may be applied to a known semiconductor manufacturing step to produce a semiconductor device that benefits from the reduced levels of crystal defects and contaminant metals.

<5. Fifth Embodiment of Plasma Treatment Method>

Fifth Embodiment of the plasma treatment method is described below. FIGS. 6A to 6C schematically represent the steps of the plasma treatment method of the present embodiment.

First, as illustrated in FIG. 6A, a target semiconductor substrate 11 is prepared. Then, an oxide film 15 of, for example, about 2 nm is formed on the semiconductor substrate 11 using a thermal oxidation method, followed by formation of a polysilicon layer on the oxide film 15. The polysilicon layer is then fabricated into a shape of a gate electrode using the photolithography technique to form a polysilicon gate electrode 19.

After forming the polysilicon gate electrode 19, three insulating layers 17A, 17B, and 17C (side walls 17) are formed over the polysilicon gate electrode 19, and over the whole surface of the oxide film 15. For example, TEOS (tetra-ethyl-ortho-silicate) layers are formed as the insulating layers 17A and 17C. For example, a SiN layer is formed as the insulating layer 17B.

The insulating layers 17A, 17B, and 17C are then etched back to form the side walls 17 on the side walls of the polysilicon gate electrode 19. Then, the oxide film 15 on the semiconductor substrate 11 is removed, except for portions underneath the polysilicon gate electrode 19 and the side walls 17.

The oxide film 15, the polysilicon gate electrode 19, and the side walls 17 are configured as semiconductor components mounted on a semiconductor device. As illustrated in FIG. 6A, the semiconductor substrate 11 has contaminant metals 12 and crystal defects 13.

In the present embodiment, the plasma treatment is performed simultaneously for the polysilicon gate electrode 19 and the semiconductor substrate 11, after forming the side walls 17.

Then, as illustrated in FIG. 6B, a plasma is created from a mixed molecular gas containing a C element and a N element, and CN active species such as CN radicals (CN.) and CN ions (CN-) are generated by using the same method described in First Embodiment. The surfaces of the semiconductor substrate 11, the polysilicon gate electrode 19, and the side walls 17 are then exposed to the CN active species.

By the treatment, the CN active species selectively react with the contaminant metals on the surfaces of the semiconductor substrate 11, the polysilicon gate electrode 19, and the side walls 17. The contaminant metals form a stable metal complex with the CN active species, and are removed from the semiconductor substrate 11.

The CN active species also selectively react with the crystal defects in the polysilicon gate electrode 19. Further, the CN active species pass through the polysilicon gate electrode 19, the side walls 17, and the oxide film 15, and selectively react with the crystal defects on the surface of the semiconductor substrate 11. Thus, even with the polysilicon gate electrode 19 and the side walls 17 formed on the surface, the CN active species can bind to crystal defects, for example, the silicon dangling bonds on the surface of the semiconductor substrate 11, and can repair the defects.

Then, the polymer layer 14 formed on the semiconductor substrate 11 during the plasma treatment is removed.

In the present embodiment, the polymer layer 14 deposits also on the polysilicon gate electrode 19 and the side walls 17. Thus, as illustrated in FIG. 6C, the polymer layer 14 is removed by the wet etching of the semiconductor substrate 11 using a chemical. The removal of the polymer layer 14 is not necessary when the plasma treatment is performed under the conditions that do not form the polymer layer 14. Finally, the surface of the semiconductor substrate 11 is washed with deionized water.

As described above, even with the side walls, the crystal defects in the semiconductor substrate 11 can be repaired by the plasma treatment performed on the surface of the semiconductor substrate 11 over the polysilicon gate electrode and the side walls. Further, the crystal defects in the polysilicon gate electrode can be simultaneously repaired with the crystal defects in the semiconductor substrate 11.

In this way, as in Fourth Embodiment, it is possible to reduce the crystal defects in the polysilicon gate electrode, and the crystal defects at the interface of the polysilicon gate electrode and the gate insulating film. The crystal defects at the interface of the semiconductor substrate 11 and the gate insulating film also can be reduced. It is therefore possible to reduce the leak current in a semiconductor device having the polysilicon gate electrode and the gate insulating film. It is also possible to improve the I-V characteristics of the transistor gate, and to reduce RTS noise, for example.

Further, the plasma treatment of the present embodiment may be performed after forming the oxide film 15, the polysilicon gate electrode 19, and the side walls 17, after forming the impurity region in the semiconductor substrate 11 in advance by ion implantation. In this way, a semiconductor device can be produced that includes, for example, a MOSFET having reduced levels of crystal defects and contaminant metals.

In this manner, the plasma treatment of the present embodiment may be applied to a known semiconductor manufacturing step to produce a semiconductor device.

<6. Sixth Embodiment of Plasma Treatment Method>

Figure 7A:
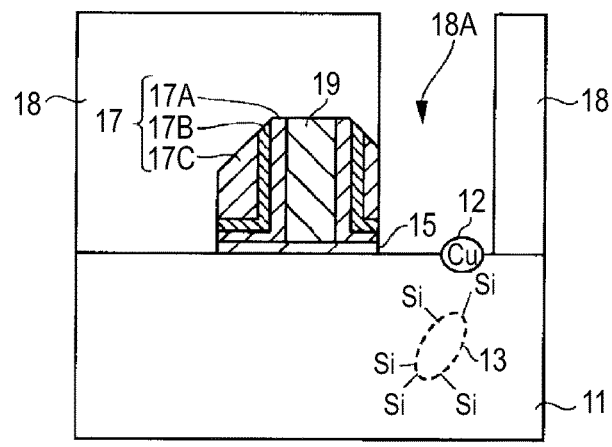
FIGS. 7A to 7C are diagrams schematically representing the steps of a plasma treatment method according to Sixth Embodiment.
Figure 7B:
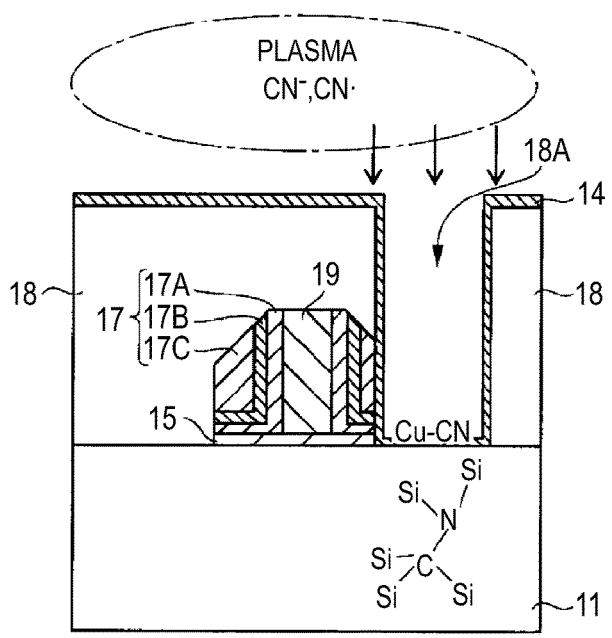
Figure 7C:
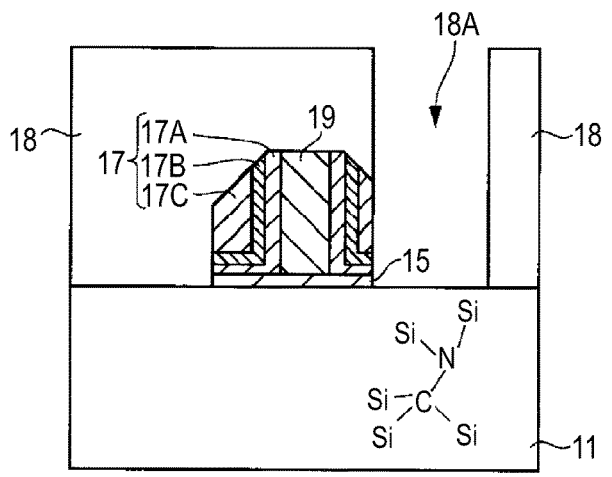

Sixth Embodiment of the plasma treatment method is described below. FIGS. 7A to 7C schematically represent the steps of the plasma treatment method of the present embodiment.

First, as illustrated in FIG. 7A, a target semiconductor substrate 11 is prepared. Then, an oxide film 15 of, for example, about 2 nm is formed on the semiconductor substrate 11 using a thermal oxidation method, followed by formation of a polysilicon layer on the oxide film 15. The polysilicon layer is then fabricated into a shape of a gate electrode using the photolithography technique to form a polysilicon gate electrode 19.

After forming the polysilicon gate electrode 19, three insulating layers 17A, 17B, and 17C (side walls 17) are formed over the polysilicon gate electrode 19, and over the whole surface of the oxide film 15. For example, TEOS (tetra-ethyl-ortho-silicate) layers are formed as the insulating layers 17A and 17C. For example, a SiN layer is formed as the insulating layer 17B.

The insulating layers 17A, 17B, and 17C are then etched back to form the side walls 17 on the side walls of the polysilicon gate electrode 19. Then, the oxide film 15 exposed from the side walls 17 is removed.

Thereafter, an interlayer insulating layer 18 is formed over the whole surface of the semiconductor substrate 11, covering the polysilicon gate electrode 19 and the side walls 17. After forming the interlayer insulating layer 18, a through hole 18A is formed at a predetermined position through the interlayer insulating layer 18 onto the surface of the semiconductor substrate 11, using the photolithography technique and anisotropic etching. In the example illustrated in FIG. 7A, the through hole 18A is formed so as to remove a portion of the side walls 17.

The oxide film 15, the polysilicon gate electrode 19, and the side walls 17 become semiconductor components mounted on a semiconductor device. A wire on the semiconductor substrate 11 and a wire on the interlayer insulating layer 18 can be connected to each other by forming a conductor inside the through hole 18A of the interlayer insulating layer 18 (the wires are not illustrated). As illustrated in FIG. 7A, the semiconductor substrate 11 has contaminant metals 12 and crystal defects 13.

In the present embodiment, the plasma treatment is performed for the surface of the semiconductor substrate 11 exposed at the bottom of the through holes 18A, after forming the through hole 18A in the interlayer insulating layer 18.

Then, as illustrated in FIG. 7B, a plasma is created from a mixed molecular gas containing a C element and a N element, and CN active species such as CN radicals (CN.) and CN ions (CN−) are generated by using the same method described in First Embodiment. The surface of the interlayer insulating layer 18, and the surface of the semiconductor substrate 11 exposed at the bottom of the through hole 18A are then exposed to the CN active species.

By the treatment, the CN active species selectively react with the contaminant metals present on the surface of the interlayer insulating layer 18, the inner surface of the through hole 18A, and the surface of the semiconductor substrate 11 in the through hole 18A. The contaminant metals form a stable metal complex with the CN active species, and are removed from the semiconductor substrate 11.

The CN active species also selectively react with the crystal defects on the surface of the semiconductor substrate 11 exposed at the bottom of the through hole 18A. The CN active species can thus bind to crystal defects, for example, the silicon dangling bonds on the surface of the semiconductor substrate 11, and can repair the defects.

The polymer layer 14 formed on the semiconductor substrate 11 during the plasma treatment is then removed. In the present embodiment, the polymer layer 14 deposits on the interlayer insulating layer 18, the inner wall of the through hole 18A, and the surface of the semiconductor substrate 11 at the bottom of the through hole 18A. Thus, as illustrated in FIG. 7C, the polymer layer 14 is removed by the wet etching of the semiconductor substrate 11 using a chemical. The removal of the polymer layer 14 is not necessary when the plasma treatment is performed under the conditions that do not form the polymer layer 14. Finally, the surface of the semiconductor substrate 11 is washed with deionized water.

As described above, the plasma treatment can reduce the contaminant metals and crystal defects on the surface of the semiconductor substrate 11 exposed in the through hole 18A formed through the interlayer insulating layer 18. This makes it possible to reduce the leak current of the semiconductor device, and to improve the I-V characteristics.

<7. Seventh Embodiment of Plasma Treatment Method>

Seventh Embodiment of the plasma treatment method is described below. FIGS. 8A to 8D schematically represent the steps of the plasma treatment method of the present embodiment.

Figure 8A:
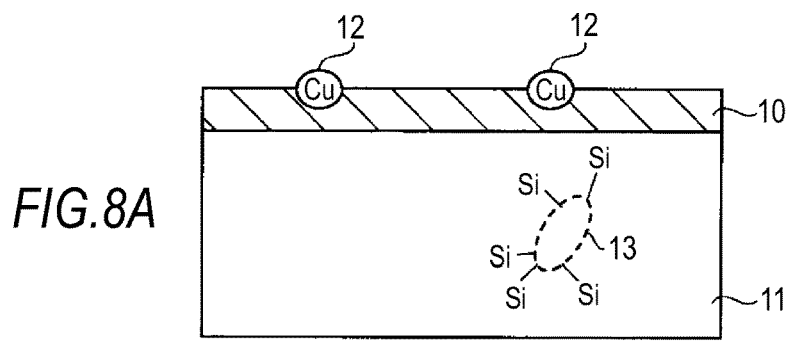
FIGS. 8A to 8D are diagrams schematically representing the steps of a plasma treatment method according to Seventh Embodiment.

First, as illustrated in FIG. 8A, a target semiconductor substrate 11 is prepared. An amorphous layer 10 is formed on the semiconductor substrate 11. For example, the amorphous layer 10 is a layer deposited on the semiconductor substrate 11 when a silicon substrate is etched under high power and high dose conditions in a manufacturing step of a semiconductor device.

Figure 8B:
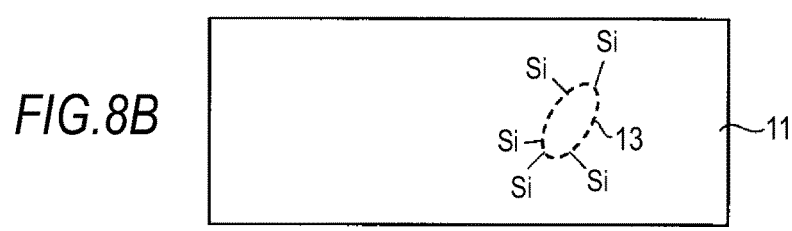

Then, as illustrated in FIG. 8B, the amorphous layer 10 is removed by CDE (Chemical Dry Etching). For example, CDE is performed under $CF_4/O_2=50/50$ sccm, 20 Pa conditions.

Figure 8C:
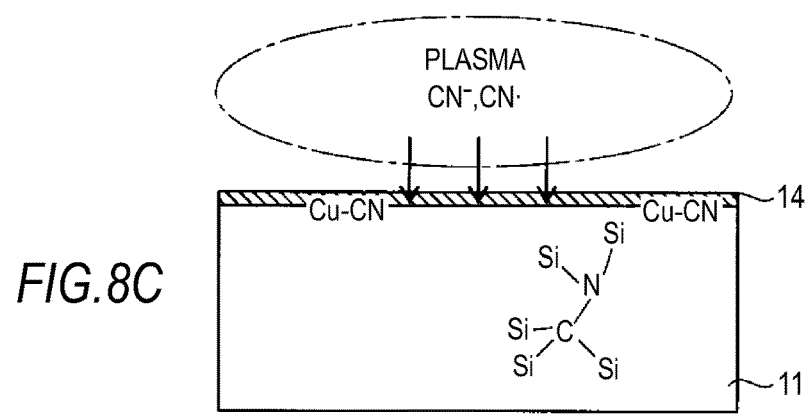

Thereafter, as illustrated in FIG. 8C, a plasma is created from a mixed molecular gas containing a C element and a N element, and CN active species such as CN radicals (CN.) and CN ions (CN−) are generated by using the same method described in First Embodiment. The surface of the semiconductor substrate 11 is then exposed to the CN active species.

Here, the temperature of the plasma treatment using the CN active species is 60° C. for the chamber wall temperature Tw, and 20° C. for the wafer temperature PT, as in First Embodiment. Because the treatment can be performed at low temperature even when materials and components having low heat resistance are formed on the semiconductor substrate 11, the plasma treatment can be performed without causing damage.

Figure 8D:
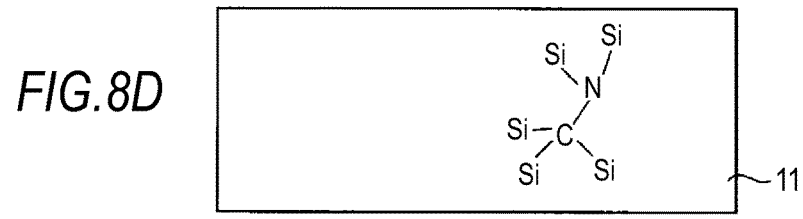

The polymer layer 14 formed on the semiconductor substrate 11 during the plasma treatment is then removed. When a fluorine gas is used as the C-containing gas, the polymer layer 14 is formed as a thin layer on the surface of the semiconductor substrate 11. Thus, as illustrated in FIG. 8D, the polymer layer 14 is removed by the wet etching of the semiconductor substrate 11 using a chemical. The removal of the polymer layer 14 is not necessary when the plasma treatment is performed under the conditions that do not form the polymer layer 14.

Finally, the surface of the semiconductor substrate 11 is washed with deionized water.

In a common treatment method of the semiconductor substrate 11 having a deposit of an amorphous layer, the crystallinity of the semiconductor substrate 11 is restored by annealing. However, high-temperature annealing is not possible when materials such as organic members and resin members of low heat resistance are formed on the semiconductor substrate 11. On the other hand, the plasma treatment of the present embodiment using the CN active species does not cause damage to such low-heat-resistant members, because the treatment temperature is lower than the heat resistant temperatures of materials such as common organic members and resin members. The plasma treatment method of the present embodiment can thus be applied also to semiconductor devices that include low-heat-resistant materials formed in multiple steps.

<8. Embodiment of Plasma Treatment Apparatus>

Figure 9:
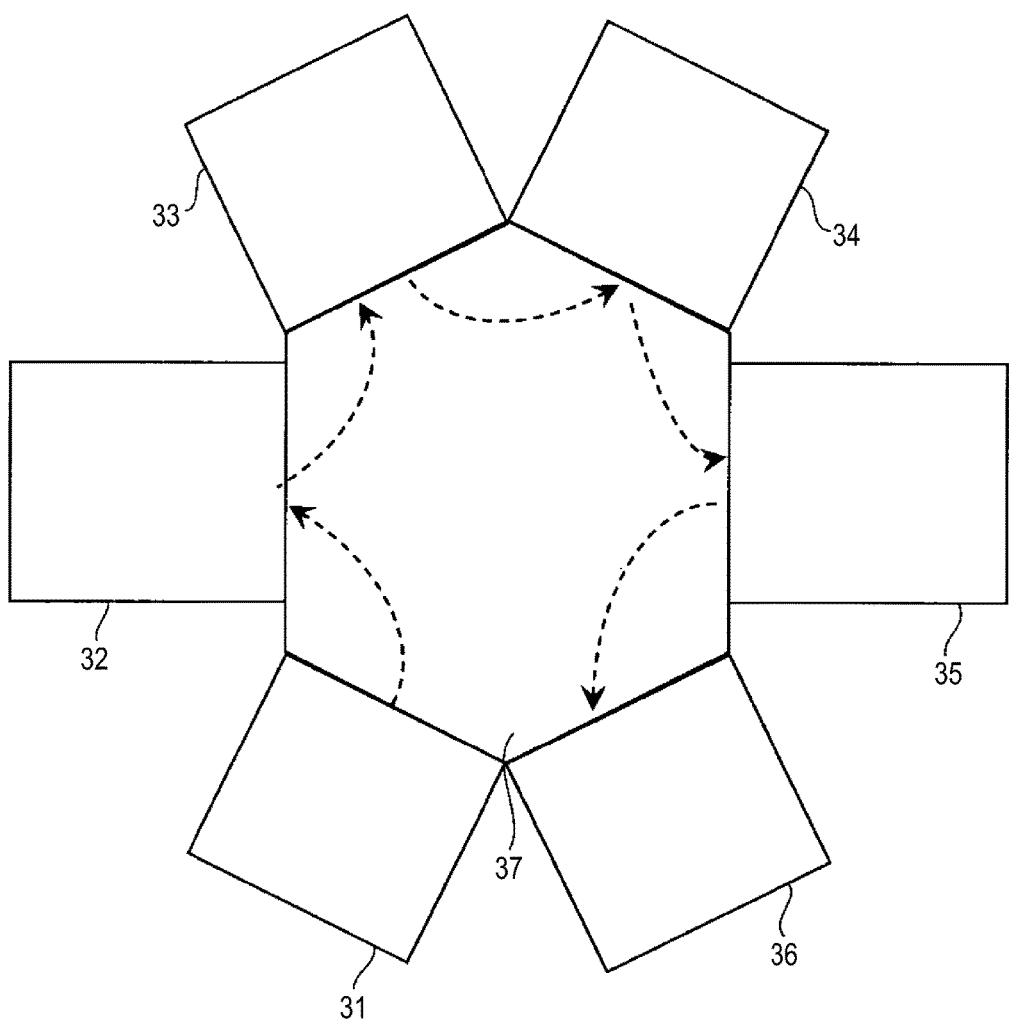
FIG. 9 is a diagram representing a configuration of a plasma treatment apparatus according to an embodiment.
Figure 10:
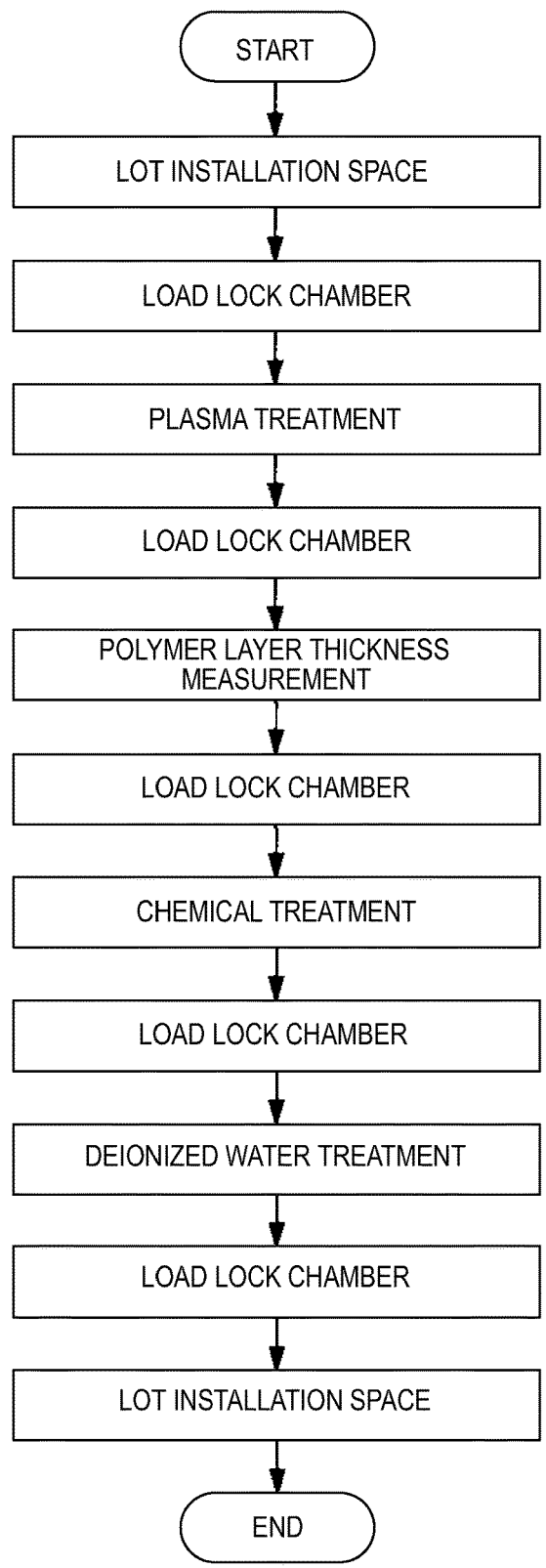
FIG. 10 is a flowchart representing a treatment using the plasma treatment apparatus of FIG. 9.

The following describes an embodiment of a plasma treatment apparatus to which the plasma treatment method is applied. FIG. 9 illustrates a schematic structure of the plasma treatment apparatus of the present embodiment. FIG. 10 represents a flow of the plasma treatment method using the plasma treatment apparatus of FIG. 9.

[Plasma Treatment Apparatus]

A plasma treatment apparatus 30 illustrated in FIG. 9 is configured from lot installation spaces 31 and 36, a transport system (load lock chamber) 37, a plasma treatment chamber 32, a polymer thickness measurement chamber 33, an organic material removing chamber 34, and a deionized water treatment chamber 35.

The lot installation space 31 houses a semiconductor substrate to be treated. The lot installation space 36 houses a treated semiconductor substrate. The semiconductor substrate is moved between the lot installation spaces 31 and 36 and the chambers via the load lock chamber 37. A vacuum is maintained in the load lock chamber 37 and in the other chambers.

The plasma treatment chamber 32 uses a known plasma treatment chamber. The plasma treatment chamber 32 is configured to include, for example, an OES (Optical Emission Spectrometry) system, a gas detoxifying unit, software including a recipe for the plasma treatment, and a control system.

The recipe for the plasma treatment contained in the software includes various conditions such as top power, bias power, chamber wall temperature, wafer temperature, gas pressure, and gas flow rate (ratio). The recipe in the software, and the control system are used to control plasma generation and to generate the CN active species.

The OES system monitors the CN emission intensity during the plasma treatment, and performs an $O_2$ cleaning step with the software and the control system according to emission intensity fluctuations.

The plasma treatment chamber 32 uses a high-toxicity gas, or the CN gas or other high-toxicity gases generate in the plasma chamber. The plasma treatment chamber 32 thus includes a detoxifying unit for these gases.

A gas supply unit (not illustrated) is connected to the plasma treatment chamber 32. The gas supply unit includes a supply unit for the C- and N-containing mixed gas for generating the CN active species used to treat the semiconductor substrate. The gas supply unit also includes a supply unit for gases, for example, such as the diluting Ar gas and other gases used for other treatments in the plasma treatment chamber 32.

The polymer thickness measurement chamber 33 is configured to include, for example, an in-situ measurement device, a control system, and database.

The polymer thickness measurement chamber 33 includes, for example, measurement devices capable of in-situ measurements, for example, such as an XPS (X-ray Photoelectron Spectroscopy) device and a spectroscopic ellipsometer, and a control system for the in-situ measurement device. The database stores the relationship between polymer thickness and chemical treatment time.

The organic material removing chamber 34 is configured to include, for example, a chemical unit, software containing a recipe for the chemical treatment, a control system, and a waste fluid unit.

The software stores various treatment conditions as a recipe for the chemical treatment. The various conditions of chemical treatment are extracted from the relationship between polymer thickness and chemical treatment time stored in the database of the polymer thickness measurement chamber 33. The recipe in the software, and the control system are used to perform the chemical treatment for removing the polymer layer deposited on the semiconductor substrate. The chemical unit supplies chemical for the chemical treatment, for example, such as $H_2SO_4$, $H_2O_2$, and $NH_4OH$ to the organic material removing chamber 34. The chemicals used in the chemical treatment are collected by the waste fluid unit.

The deionized water treatment chamber 35 is configured to include, for example, a chemical unit, software containing a recipe for deionized water treatment, a control system, and a waste fluid unit.

The deionized water treatment chamber 35 is provided to wash and remove, for example, contamination and foreign objects on the semiconductor substrate surface, using deionized water. The chemical unit supplies washing liquids, such as deionized water and various other washing liquids for washing the semiconductor substrate, to the deionized water treatment chamber 35. The semiconductor substrate is washed by using the recipe stored in the software, and the control system. The chemicals used for the washing are collected by the waste fluid unit.

[Treatment Flow]

A flow of the plasma treatment method using the plasma treatment apparatus 30 shown in FIG. 9 is described below with reference to FIG. 10.

First, a semiconductor substrate placed in the lot installation space 31 is sent to the plasma treatment chamber 32 via the load lock chamber 37 disposed at the center. The semiconductor substrate transferred from the lot installation space 31 to the plasma treatment chamber is then subjected to the plasma treatment.

In the plasma treatment chamber 32 provided with, for example, CCP, ICP, and ECR, the surface treatment is performed using the CN active species generated by the plasma controlled according to a recipe that includes, for example, top power, bias power, chamber wall temperature, wafer temperature, gas pressure, and gas flow rate (ratio), as in the foregoing embodiments of the plasma treatment method.

The OES system constantly monitors the CN emission intensity (for example, emission at 387 nm wavelength) throughout the plasma treatment, and automatically performs the $O_2$ cleaning step between the treated wafers according to emission intensity fluctuations. For example, the $O_2$ cleaning step is performed for 20% or greater emission intensity fluctuations with respect to the reference intensity. Further, the $O_2$ cleaning step is performed, for example, at an $O_2$ flow rate of 500 sccm, and a top power/bias power=1,000/100 W for 1 min.

After the plasma treatment, the semiconductor substrate is sent to the polymer thickness measurement chamber 33 via the load lock chamber 37. In the polymer thickness measurement chamber 33, the thickness of the polymer layer deposited on the semiconductor substrate is measured. The polymer layer thickness is measured in situ in the polymer thickness measurement chamber 33 using a thickness measurement device installed in the chamber. The measured thickness value of the polymer layer is then compared with the thickness-treatment time relationship stored in the database to automatically decide the chemical treatment time for the subsequent step.

After the measurement, the semiconductor substrate is sent to the organic material removing chamber 34 via the load lock chamber 37, and chemically treated for the specified time period. The chemicals necessary for the treatment, for example, such as $H_2SO_4$, $H_2O_2$, $NH_4OH$, are supplied to the chamber from a tank storing these chemicals, and the chemical treatment is performed for the treatment time automatically decided as above.

After the chemical treatment, the semiconductor substrate is sent to the deionized water treatment chamber 35 via the load lock chamber 37, and the substrate surface is washed. The semiconductor substrate subjected to the all treatments as above is transported to the lot installation space 36 via the load lock chamber 37.

The plasma treatment of the semiconductor substrate completes after this flow.

Note that the plasma treatment conditions described in the foregoing embodiments may be the same as the conditions described in First Embodiment. The conditions, including the gas species, treatment time t, gas pressure P, chamber wall temperature Tw, and wafer temperature T may also be appropriately changed. The plasma treatment conditions are optimized according to the type of the semiconductor substrate and the gas species used, so as to make the treatment by the CN active species highly effective.

Further, the plasma treatment methods of the foregoing Second to Seventh Embodiments are also applicable to a semiconductor device manufacturing method, by forming a semiconductor component or other components on the semiconductor substrate as in First Embodiment. Further, a semiconductor device using the plasma treatment methods of Second to Seventh Embodiments may be used to form an electronic device as in First Embodiment.

The present technology may be configured as follows.

(1) A plasma treatment method including:
creating a plasma from a mixed gas containing carbon and nitrogen to generate CN active species, and treating a surface of a semiconductor layer of a semiconductor substrate with the CN active species.

(2) The plasma treatment method according to (1), wherein the CN active species passivate the semiconductor layer on a surface of the semiconductor substrate.

(3) The plasma treatment method according to (1) or (2), wherein the mixed gas contains at least one selected from $CHF_3$, $CH_2F_2$, $C_4F_8$, $C_5F_8$, CO, $C_2H_5OH$, and $CH_3OH$.

(4) The plasma treatment method according to any one of (1) to (3), wherein a bias power of from 0 W to 50 W is applied to the semiconductor substrate.

(5) The plasma treatment method according to any one of (1) to (4), wherein a top power used to create the plasma ranges from 1,000 W to 2,000 W.

(6) The plasma treatment method according to any one of (1) to (5), wherein a polymer layer deposited on the semiconductor substrate is chemically removed after the semiconductor substrate is treated with the CN active species.

(7) A method for manufacturing a semiconductor device, the method including: performing the plasma treatment of any one of (1) to (6); and forming a semiconductor component on the semiconductor substrate.

(8) A plasma treatment apparatus, including a plasma treatment unit that performs the plasma treatment of any one of (1) to (6).

(9) The plasma treatment apparatus according to (8), wherein the plasma treatment unit includes software that contains a recipe for plasma treatment conditions used to generate the CN active species.

(10) The plasma treatment apparatus according to (8) or (9), wherein the plasma treatment unit includes a CN gas detoxifying unit.

The present disclosure contains subject matter related to that disclosed in Japanese Priority Patent Application JP 2011-156533 filed in the Japan Patent Office on Jul. 15, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A plasma treatment method, comprising:
creating a plasma from a mixed gas containing carbon and nitrogen;
generating, based on the plasma, a CN active species;
treating a first surface of a semiconductor substrate with the CN active species to reduce at least one of metal contaminants or crystal defects in the semiconductor substrate;
forming a polymer layer on the semiconductor substrate based on the treatment;
determining a thickness value of the polymer layer on the semiconductor substrate;
determining a first time period based on the thickness value; and
removing the polymer layer from the semiconductor substrate, based on chemical treatment of the polymer layer for the first time period,
wherein a second surface of the semiconductor substrate is above the first surface.

2. The plasma treatment method according to claim 1, further comprising applying a first bias power, that is in a range of 0 W to 50 W, to the semiconductor substrate.

3. The plasma treatment method according to claim 2, wherein the first bias power is in a range of 0 W to 20 W.

4. The plasma treatment method according to claim 2, wherein the first bias power is based on at least one of the mixed gas or the thickness value of the polymer layer.

5. The plasma treatment method according to claim 1, wherein a maximum power for creation of the plasma ranges from 1,000 W to 2,000 W.

6. The plasma treatment method according to claim 1, further comprising monitoring a CN emission intensity value of the CN active species.

7. The plasma treatment method according to claim 6, further comprising $O_2$ cleaning based on fluctuations in the CN emission intensity value.

8. A method for manufacturing a semiconductor device, the method comprising:
creating a plasma from a mixed gas containing carbon and nitrogen;
generating, based on the plasma, a CN active species;
treating a first surface of a semiconductor substrate with the CN active species to reduce at least one of metal contaminants or crystal defects in the semiconductor substrate;
forming a polymer layer on the semiconductor substrate based on the treatment;
determining a thickness value of the polymer layer on the semiconductor substrate;
determining a first time period based on the thickness value;
removing the polymer layer from the semiconductor substrate, based on chemical treatment of the polymer layer for the first time period,
wherein a second surface of the semiconductor substrate is above the first surface; and
forming a semiconductor component on the semiconductor substrate.

9. A plasma treatment apparatus, comprising:
a plasma treatment chamber configured to:
create a plasma from a mixed gas containing carbon and nitrogen;
generate, based on the plasma, a CN active species;
treat a first surface of a semiconductor substrate with the CN active species, to reduce at least one of metal contaminants or crystal defects in the semiconductor substrate; and
form a polymer layer on the semiconductor substrate based on the treatment;
a polymer thickness measurement chamber configured to:
determine a thickness value of the polymer layer; and
determine a first time period based on the thickness value; and
an organic material removing chamber configured to:
remove the polymer layer from the semiconductor substrate, based on chemical treatment of the polymer layer for the first time period,
wherein a second surface of the semiconductor substrate is above the first surface.

10. The plasma treatment apparatus according to claim 9, wherein the plasma treatment chamber is further configured to store instructions that indicate plasma treatment conditions for generation of the CN active species.

11. The plasma treatment apparatus according to claim 9, wherein the plasma treatment chamber includes a CN gas detoxifying unit.

12. A plasma treatment method, comprising:
creating a plasma from a mixed gas,
wherein the mixed gas contains a carbon containing gas, a nitrogen containing gas and an inert gas, wherein the carbon containing gas is selected from a first group consisting of $CHF_3$, $CH_2F_2$, $C_4F_8$, $C_5H_8$, $CO$, $C_2H_5OH$, and $CH_3OH$,
wherein the nitrogen containing gas is selected from a second group consisting of $N_2$ and $NH_3$, and
wherein the inert gas is selected from a third group consisting of Ar and He;
generating, based on the plasma, a CN active species;
treating, a first surface of a semiconductor substrate with the CN active species to reduce at least one of metal contaminants or crystal defects in the semiconductor substrate, based on:
a first gas flow rate of the carbon containing gas that is 100 sccm,
a second gas flow rate of the nitrogen containing gas that is 100 sccm,
a gas flow rate of the inert gas that is 500 sccm,
a gas pressure that is 30 mTorr,
a treatment time that is 10 seconds,
a top power that is in a first range from 1,000 W to 2,000 W, and
a bias power that is in a second range from 0 W to 50 W;
forming a polymer layer on the semiconductor substrate based on the treatment;
determining a thickness value of the polymer layer on the semiconductor substrate;
determining a first time period based on the thickness value; and
removing the polymer layer from the semiconductor substrate, based on chemical treatment of the polymer layer for the first time period,
wherein a second surface of the semiconductor substrate is above the first surface.

13. The plasma treatment method according to claim 12, wherein the bias power is based on at least one of the mixed gas or the thickness value of the polymer layer.

* * * * *